United States Patent
Kawakubo et al.

[11] Patent Number: 6,077,406
[45] Date of Patent: Jun. 20, 2000

[54] SPUTTERING SYSTEM

[75] Inventors: Takashi Kawakubo, Yokohama; Kenya Sano, Kawasaki; Ryoichi Ohara, Tokyo-To; Katsutaro Ichihara, Yokohama, all of Japan

[73] Assignee: Kabushiki Kaisha Toshiba, Kawasaki, Japan

[21] Appl. No.: 09/292,623

[22] Filed: Apr. 16, 1999

[30] Foreign Application Priority Data

Apr. 17, 1998 [JP] Japan .................................. 10-107762

[51] Int. Cl.⁷ .................................................. C23C 14/00
[52] U.S. Cl. .................. 204/298.12; 204/298.26; 204/298.06; 204/298.09; 204/298.15; 204/298.17; 204/298.18; 204/298.21
[58] Field of Search .................. 204/298.12, 298.26, 204/298.06, 298.15, 298.16, 298.17, 298.18, 298.21, 298.22, 298.23, 298.09

[56] References Cited

FOREIGN PATENT DOCUMENTS

| 57-158380 | 9/1982 | Japan . |
| 62-77459 | 4/1987 | Japan . |
| 63-227772 | 9/1988 | Japan . |
| 1-298154 | 12/1989 | Japan . |
| 6-17248 | 1/1994 | Japan . |

Primary Examiner—Alan Diamond
Attorney, Agent, or Firm—Oblon, Spivak, McClelland, Maier & Neustadt, P.C.

[57] ABSTRACT

A sputtering system comprises: a substrate holder for holding a substrate; and a cathode having a magnet therein and holding a target, the cathode being off-axis aligned with respect to the substrate. The cathode may comprise a plurality of cathodes, each of which has a flat backing plate, and two targets supported on both sides of the backing plate, the target being off-axis aligned with respect to the thin-film deposited surface of the substrate. The target may be supported on the side surface of a cylindrical or prismatic cathode body having a magnet therein, and the target being off-axis aligned with respect to the thin-film deposited surface of the substrate. Thus, if at least a part of the plurality of cathodes face the thin-film deposited surface of the substrate to be off-axis aligned, it is possible to enhance the inplane uniformity of film thickness, composition and crystallinity of a thin-film deposited on a substrate having a large diameter while inhibiting the substrate from being damaged by the irradiation with high energy particles, and to accelerate the thin film deposition rate.

14 Claims, 9 Drawing Sheets

FIG. 17B ns of the thin film.

However, in the parallel plate sputtering system, particularly in a case where an oxide target or the like is used, negative ions, such as oxygen ions, emitted from the target 3 are accelerated by a cathode sheath to produce high energy particles, which irradiate the substrate 1 facing the target surface and damage the substrate 1. For that reason, there is a problem in that the deterioration of crystallinity, the divergence in composition, the roughness on the surface and so forth are caused on the thin-film formed on the substrate 1, so that it is difficult to form a high functional oxide film or the like.

In order to solve the aforementioned problems caused by the high energy particles, some attempts have been made when functional thin-films including oxide films, such as superconductive oxide films, ferromagnetic oxide films and ferroelectric oxide films, are formed by a sputtering method.

Figure 1:
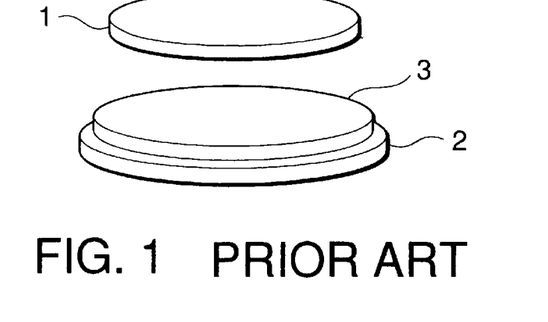
FIG. 1 is a perspective view showing a schematic structure of a principal part of a conventional parallel plate sputtering system.
Figure 2:
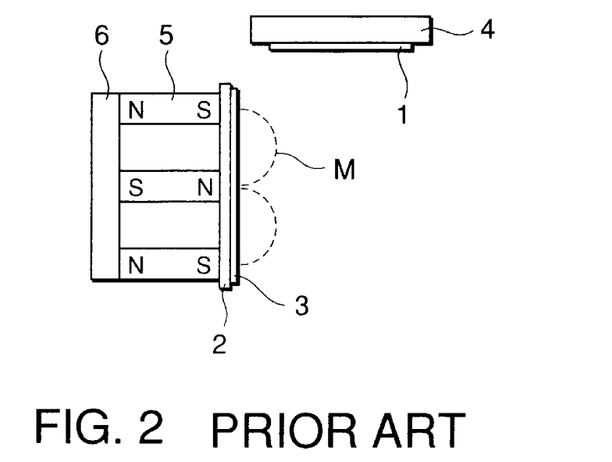
FIG. 2 is a perspective view showing a schematic structure of a principal part of an example of a conventional off-axis sputtering system.

As a first method, there is known the off-axis alignment wherein the axis of the substrate 1 is perpendicular to the axis of the target 3 as shown in FIG. 2 (see, e.g., C. B. Eom et al, "In situ grown YBCO thin films from single-target magnetron sputtering", Appl. Phys. Lett. Vol.55, p595, 1989). In FIG. 2, reference number 4 denotes a substrate holder, 5 denotes a magnet, and 6 denotes a pole piece. The magnet 5 is associated with the pole piece 6 to produce lines M of magnetic force on the surface of the target 3.

As can be seen from FIG. 2, there is not much irradiation damage caused by particles radiated on the line extending from the target surface, since the substrate 1 is perpendicular to the target 3. However, in the off-axis sputtering system, there is another problem in that the uniformity on the surface of the substrate deteriorates. That is, in the off-axis alignment unlike the parallel plate sputtering system, the distance from the target 3 and the perspective angle are different at different positions on the substrate, so that the density, composition ratio and energy of incident particles are different at different positions. Therefore, there is a problem in that the differences in the film thickness distribution, composition and crystallinity are made between near and far sides from the target 3 on the substrate 1.

The above described ununiformity of inplane distribution is more conspicuous as the diameter of the substrate 1 increases. Although it appears that this problem can be solved by increasing the diameter of the target with respect to the diameter of the substrate, it is not possible to do so since the ununiformity of inplane distribution is under the strong control of the ratio of the mean free path of sputtered particles to the diameter of the substrate. That is, since a usual sputter gas pressure is in the range of from about 0.1 Pa to about 1 Pa, at which plasma is produced, the mean free path is in the range of from about 10 mm to about 100 mm.

The percentage of particles of high energy progressive components is large at a distance of the mean free path or less, and the percentage of low energy scattered particles is high as the distance increases. Therefore, it is very difficult to increase the diameter of the substrate in the off-axis aligned sputtering system.

Figure 3:
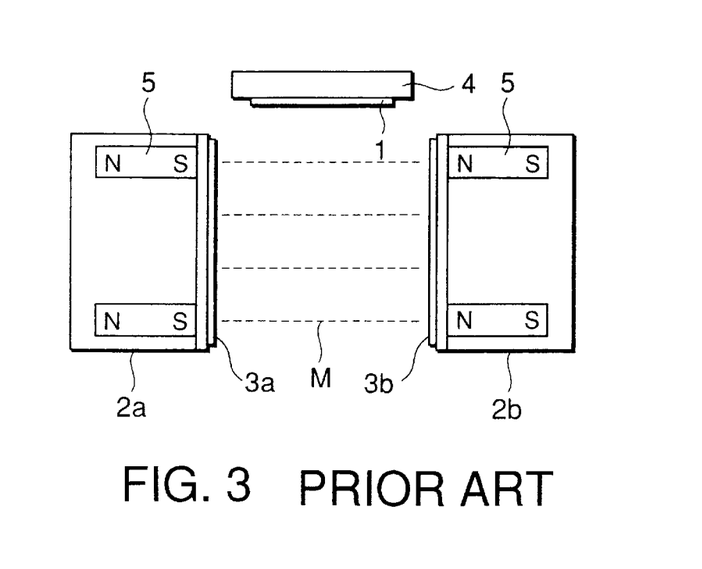
FIG. 3 is a perspective view showing a schematic structure of a principal part of another example of a conventional off-axis sputtering system.

As another example of an off-axis aligned sputtering system, there is known a system using two targets 3a and 3b facing each other as shown in FIG. 3 (see, e.g., Japanese Patent Laid-Open No. 57-158380). In this system, the two targets 3a and 3b facing each other are mounted on backing plates 2a and 2b, each of which has magnets 5 therein, and a substrate 1 is arranged on the side between the targets 3a and 3b so as to be turned by 90 degrees. All of the polarities of the magnets 5 in each of the targets 3a and 3b are the same, and the N pole of each of the magnets 5 faces the S pole of the adjacent magnet between the targets 3a and 3b. Therefore, a magnetic field is confined between the two targets 3a and 3b to produce a uniform magnetic field M perpendicular to the target surfaces.

Moreover, in order to increase the diameter of the substrate, there is proposed a sputtering system wherein a plurality of targets are arranged around a substrate in the form of a polygon (see Japanese Patent Laid-Open No. 6-17248). In this case, a uniform magnetic field is formed in a space surrounded by the plurality of targets.

If two or a plurality of targets are arranged around a substrate as described above, it is possible to improve the inplane uniformity. However, for the aforementioned reason, the diameter capable of ensuring the inplane uniformity is about twice as large as that when a single target is used, and it is only possible to ensure the inplane uniformity of a substrate having a diameter of about 100 mm. Therefore, it is very difficult to actually apply the off-axis aligned sputtering system even if the characteristic of the functional thin-film and so forth can be improved by the off-axis alignment, since it is required that an integrated circuit substrate should have a large diameter of 200 to 300 mm and strictly have inplane uniformity.

Figure 4A:
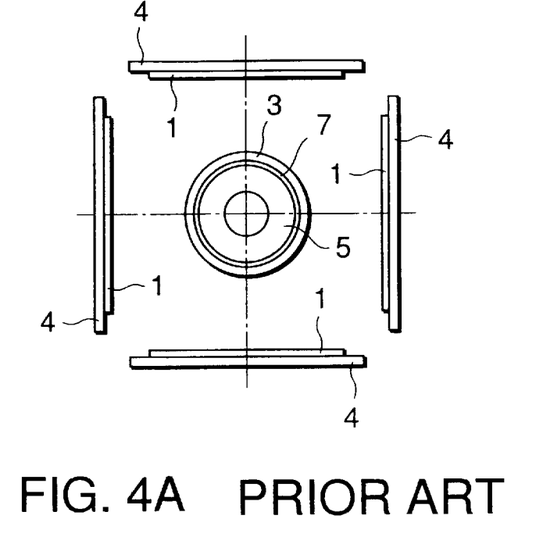
FIG. 4A is a plan view showing the structure of a principal part of an example of a conventional coaxial sputtering system.
Figure 4B:
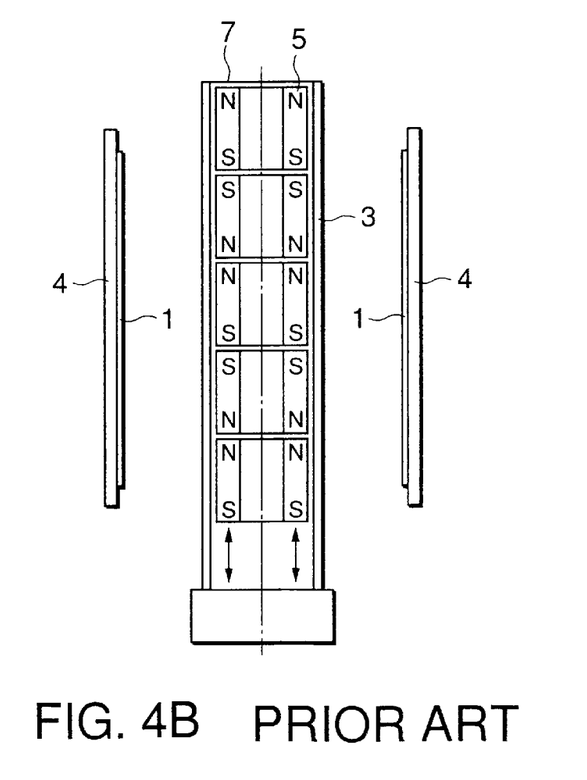
FIG. 4B is a sectional view thereof.

As a second method, there is known a method for using a cylindrical cathode 7, which has a magnet 5 therein and a cylindrical target 3 on the outer periphery thereof, to arrange substrates 1 around the cathode 7 as shown in FIGS. 4A and 4B. As a similar method, there is also known a method for using a hemispherical cathode to arrange substrates around the cathode so as to face each other via the cathode. If the cylindrical or hemispherical cathode is used, high energy particles are emitted radially, so that damage to the substrate 1 is less than that in the parallel plate sputtering system.

However, in the conventional sputtering systems using the cylindrical or hemispherical cathodes, the area of the target is small with respect to the area of the substrate, so that there is a problem in that the thin-film deposition rate decreases. Moreover, there is a problem in that it is difficult to prepare a cylindrical target having a large diameter, particularly it is very difficult to prepare a target of a ceramic, such as an oxide film. Therefore, it is difficult to cope with a large flat substrate, similar to the conventional off-axis sputtering systems.

As described above, according to the conventional typical off-axis sputtering systems, there is a problem in that the uniformity on the surface of a substrate deteriorates although irradiation damage caused by high energy particles reduces.

Although the ununiformity on the surface of a substrate can be removed by arranging two or a plurality of targets around the substrate to produce a uniform magnetic field in a direction perpendicular to the surface of the target, this method can only ensure the inplane uniformity on a substrate having a diameter of about 100 mm or less, so that it is difficult to actually apply this method to an integrated circuit substrate which is required to have a large diameter of 200 to 300 mm.

On the other hand, the damage caused by high energy particles can be reduced by using the cylindrical or hemispherical cathode. However, in the conventional sputtering systems using the cylindrical or hemispherical cathodes, the thin-film deposition rate decreases, and it is very difficult to prepare a large cylindrical or hemispherical target of a ceramic, such as an oxide film, so that it is difficult to cope with a large flat substrate similar to the conventional off-axis sputtering systems.

SUMMARY OF THE INVENTION

It is therefore an object of the present invention to eliminate the aforementioned problems and to provide a sputtering system, which can improve the inplane uniformity of film thickness, composition, crystallinity and so forth on a large diameter substrate, particularly the inplane uniformity of a functional thin-film, such as a superconductive oxide thin-film, a ferromagnetic oxide film and a ferroelectric oxide film, while reducing irradiation damage caused by high energy particles, and which can provide an accelerated thin-film deposition rate.

In order to accomplish the aforementioned and other objects, according to one aspect of the present invention, a sputtering system comprises: a substrate holder for holding a substrate; and a plurality of cathodes, each of which has a flat backing plate having a magnet therein and two targets supported on both sides of the backing plate, the target being off-axis aligned with respect to the thin-film deposited surface of the substrate.

In the sputtering system according to the first aspect of the present invention, the plurality of cathodes may be arranged so as to be substantially parallel to each other or in parallel crosses. In such arrangements, at least a part of the plurality of cathodes are preferably arranged so as to face the thin-film deposited surface of the substrate at positions including the thin-film deposited surface. However, it is not limited thereto when the substrate holder and the plurality of cathodes are relatively movable.

According to a second aspect of the present invention, a sputtering system comprises: a substrate holder for holding a substrate; and a plurality of cathodes, each of which has a columnar or prismatic cathode body having a magnet therein and a target extending along the outer peripheral surface of the cathode body to be supported thereon, and each of which is arranged so as to face the thin-film deposited surface of the substrate.

In the sputtering system according to the second aspect of the present invention, the cathode body has, e.g., a cylindrical, prismatic or hemispherical shape. In these cases, the target may extend along the cylindrical surface of the cylindrical cathode body, the side surface of the prismatic cathode body or the hemispherical surface of the hemispherical cathode body to be supported thereon.

In the sputtering system according to the second aspect of the present invention, the cathode body may be arranged so that the axis of, e.g., the columnar or prismatic shape is off-axis aligned with respect to the thin-film deposited surface or substantially parallel to the thin-film deposited surface of the substrate.

In the sputtering system according to the first aspect of the present invention, since the targets are arranged on both sides of the flat plate backing plate, the cathodes can be arranged so that the targets are off-axis aligned at positions facing the thin film deposited surface of the substrate, unlike the conventional off-axis alignment. wherein the cathodes are arranged only around the substrate. Therefore, if the diameter of a substrate is large, it is possible to easily cope with the substrate only by increasing the number of cathodes.

According to the first aspect of the present invention, it is possible to enhance the inplane uniformity of film thickness, composition and crystallinity even if a high functional film, such as a superconductive oxide film, a ferromagnetic oxide film and a ferroelectric oxide film, is deposited on a substrate having a large diameter, while inhibiting the substrate from being damaged by the irradiation with high energy particles during the deposition of the thin-film. That is, it is possible to cope with a large flat substrate or the like.

In the sputtering system according to the second aspect of the present invention, since the target is arranged along the outer peripheral surface of the columnar or prismatic cathode body, it is possible to provide an optional number of cathodes at optional positions facing the thin-film deposited surface of the substrate, unlike the conventional off-axis alignment wherein the cathodes are arranged only around the substrate. Therefore, if the diameter of a substrate is large, it is possible to easily cope with the substrate only by increasing the number of cathodes.

In addition, it is possible to inhibit the substrate from being damaged by the irradiation with high energy particles during the thin-film deposition on the substrate, by off-axis aligning the columnar or prismatic cathode with respect to the thin-film deposition surface of the substrate Even if the axis of the columnar or prismatic cathode is parallel to the thin-deposition surface of the substrate, if the shape of the cathode body is cylindrical or hemispherical, it is possible to inhibit the substrate from being damaged by the irradiation with high energy particles. Moreover, when a high functional thin-film, such as a superconductive oxide film, a ferromagnetic oxide film and a ferroelectric oxide film, is deposited on a substrate having a large diameter, it is possible to enhance the inplane uniformity of film thickness, composition, crystallinity and so forth in accordance with the number of the cathodes. That is, it is possible to cope with a large flat substrate or the like.

DESCRIPTION OF THE PREFERRED EMBODIMENTS

Referring now to the accompanying drawings, the preferred embodiments of the present invention will be described in detail below.

Figure 5:
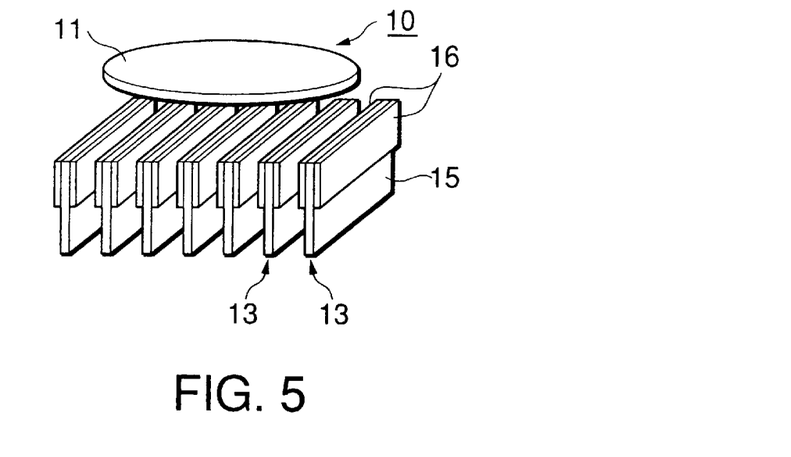
FIG. 5 is a perspective view showing a schematic structure of a principal part of the first preferred embodiment of a sputtering system according to the present invention.
Figure 6A:
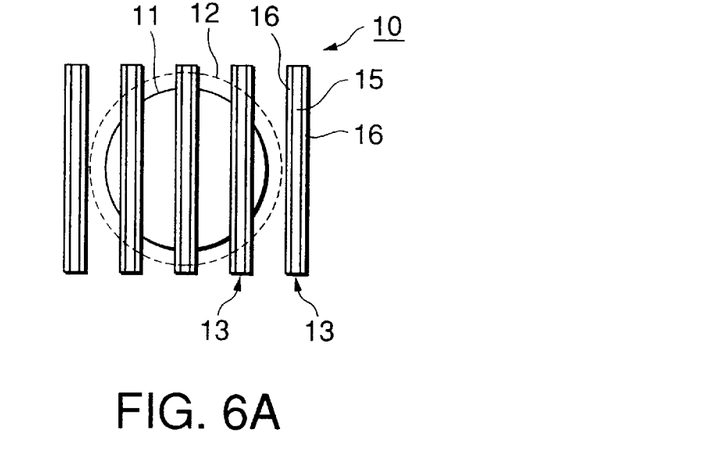
FIG. 6A is a plan view showing the arrangement of the sputtering system of FIG. 5.
Figure 6B:
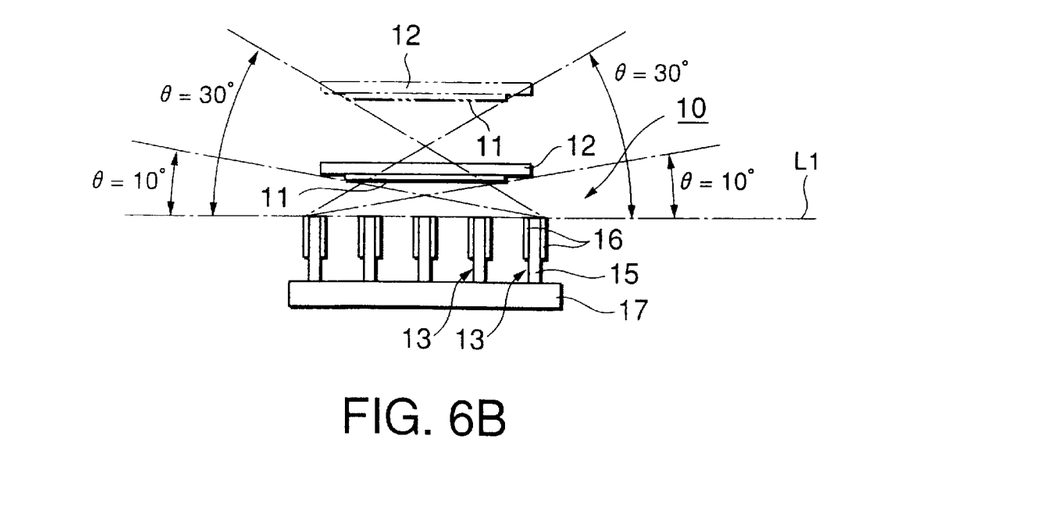
FIG. 6B is a side view thereof.

FIGS. 5, 6A and 6B show a schematic construction of a principal part of the first preferred embodiment of a sputtering system according to the present invention. FIG. 5 is a perspective view of a principal part of the first preferred embodiment of a sputtering system according to the present invention, and FIGS. 6A and 6B are plan and side views thereof, respectively.

In an off-axis sputtering system 10 shown in these drawings, a substrate 11, on which a thin-film is deposited, is held on the bottom surface of a substrate holder 12. Furthermore, the substrate holder 12 is not shown in FIG. 5. A substrate heating mechanism and so forth are provided in the substrate holder 12, if necessary.

In FIG. 5, a plurality of cathodes 13 project so as to face the thin-film deposited surface of the substrate 11. Each of the plurality of cathode 13 has a plurality of magnets 14 and a flat backing plate 15 having a cooling mechanism (not shown) therein, as shown in any one of FIGS. 7 through 9. The flat backing plate 15 is arranged so that both major surfaces thereof are perpendicular to the thin-film deposition surface on the substrate 11. The plurality of cathodes 13, each of which has such a flat backing plate 15, are arranged so as to be parallel to each other.

On both major surfaces of the flat backing plate 15, targets 16 are mounted. That is, each of the cathodes 13 has two targets 16 supported on both sides of the flat backing plate 15, and the targets 16 of the adjacent cathodes 13 face each other. Therefore, the component emitted from each of the targets 16 in a direction perpendicular thereto is adhered to the target 16 of the facing cathode 13 to be reused.

Each of the targets 16 mounted on the flat backing plates 15 is off-axis aligned with respect to the thin-film deposited surface of the substrate 11. That is, each of the targets 16 is arranged so that the surface (target surface) thereof is perpendicular to the thin-film deposited surface of the substrate 11. It is not always required that the angle between the substrate 11 and the target 16 be strictly 90 degrees, and it may be suitably set to be in the range of, e.g., from about 60 degree to about 120 degree. Throughout the specification, the term "off-axis alignment" includes such an angular relationship.

With respect to the positional relationship between the substrate 11 and the plurality of cathodes 13, at least a part of the plurality of cathodes 13 at positions facing and including the thin-film deposited surface of the substrate 11, in the aforementioned off-axis alignment. The number of the cathodes 13 is suitably set in accordance with the diameter of the substrate 11 (the area of the thin-film deposited surface), the size of each of the cathodes 13 and the positions of the cathodes 13. For example, when a functional thin-film or the like is deposited on a substrate 11 having a diameter of about 200 mm to about 300 mm, about 4 to 20 cathodes 13 are preferably provided if the parallel arrangement shown in FIGS. 5, 6A and 6B is applied.

However, the substrate 11 and the plurality of cathodes 13 can be relatively moved, and in this case, it is possible to uniformly deposit a thin-film using a smaller number of cathodes. The plurality of cathodes 13 can be provided on a supporting table 17 to easily move and replace the targets 16. The plurality of cathodes 13 provided on the supporting table 17 can be simultaneously replaced for each supporting table 17.

The distance between the end surface of the cathode 13, on both major surfaces of which the targets 16 are mounted, and the substrate 11 can be limited by the range of an angle θ between the level L1 of the end surface of the cathode 13 and the outermost target 16 in accordance with the thin-film deposition efficiency obtained by the targets. In an off-axis alignment wherein the substrate 11 is perpendicular to the targets 16, the distance between the end surface of the cathode 13 and the substrate 11 can be set to be a predetermined distance so as to obtain the maximum thin-film deposition efficiency if the angles between the level L1 and the targets 16 at both ends are the same angles ranging from θ=10° to θ=30° as shown in FIG. 6B. Furthermore, the angle θ described so as to be preferably in the range of 10° to 30° is only an example, and the present invention should not be limited thereto.

The magnet built in the backing plate 15 should not be limited to the permanent magnet 14, but it may be an electromagnet. A suitable magnet may be selected from these magnets. Since the thickness of the cathode 13, i.e., the thickness of the magnet, is preferably small, it is desired to use a magnet having a great coercive force, such as a neodymium-iron-boron magnet and a samarium-cobalt magnet, as the permanent magnet 14.

The number of the magnets in the backing plate 15 may be one or plural. When a plurality of magnets are used, the arrangement relationship between the magnets should be an alignment relationship, which will be described later. Moreover, when a plurality of magnets are arranged in each of the cathodes 13, the magnets may be suitably connected to each other by means of a pole piece or yoke.

The magnets in the cathode 13 may be movable in the backing plate 15. As will be described later, when the magnets are arranged so as to produce an ununiform magnetic field, the movement of the magnets is effective in the uniform use of the target 16 and the uniform deposition of film thickness on the substrate 11. When the magnets are moved, the magnets may be mechanically connected directly to a moving mechanism, or indirectly thereto by means of a magnet coupling mechanism.

The method for arranging the magnets 14 in the backing plate 15 may be suitably selected from various methods which will be described below.

Figure 7:
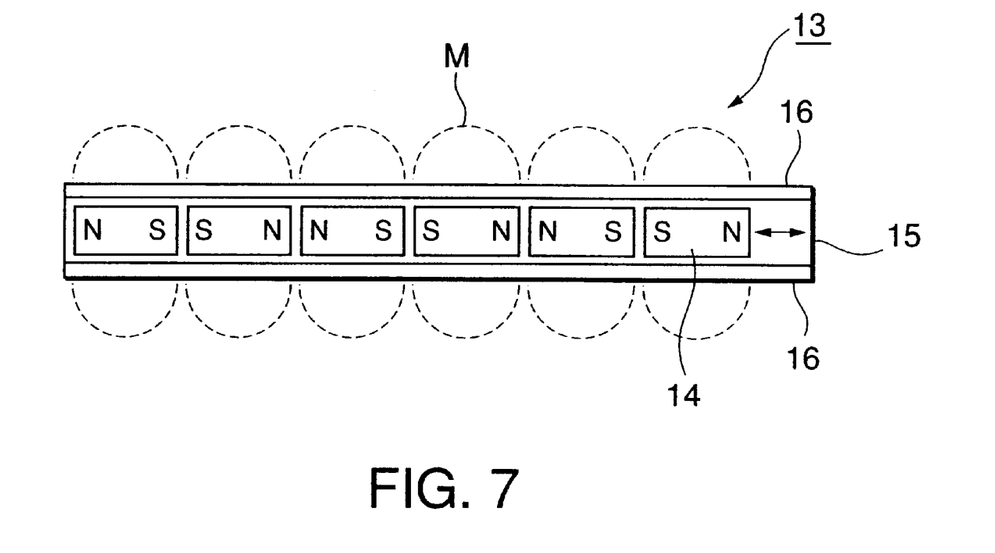
FIG. 7 is a schematic view showing an example of a cathode structure for use in the sputtering system of FIG. 5.

(A) A single or a plurality of magnets 14 are used, and the magnetizing direction is set to be parallel to the target surface and the substrate surface. FIG. 7 shows an example of a case where a plurality of magnets 14 are used. In this case, the plurality of magnets 14 are arranged so that the magnetic poles of the adjacent magnets 14 are the same, i.e., so that the magnetizing directions of the adjacent magnets 14 are reverse to each other. The magnetizing direction may be perpendicular to the substrate surface in accordance with the size of the backing plate 15 and so forth. The magnetic poles of the magnets between the adjacent cathodes 13 are set to be the same pole.

Figure 8:
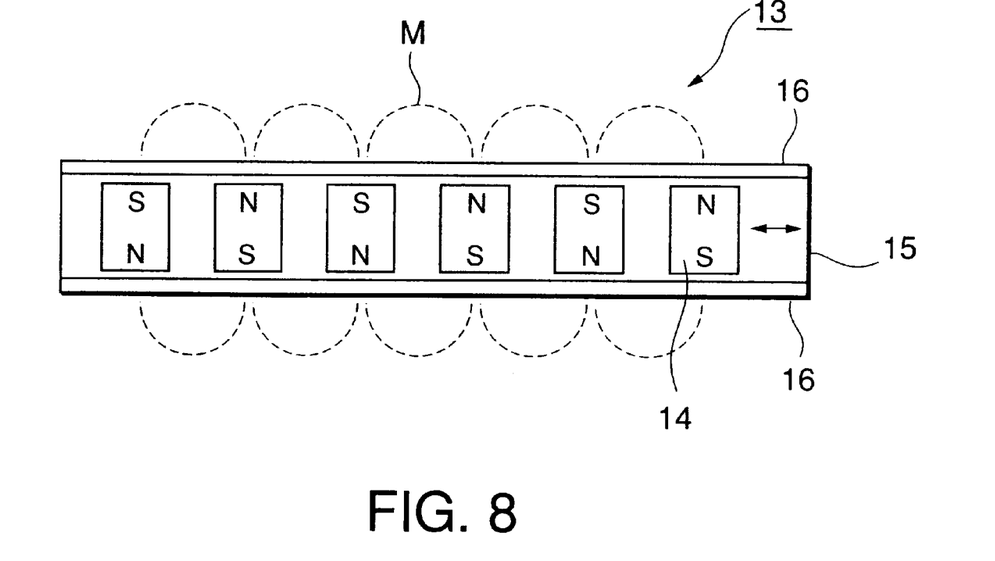
FIG. 8 is a schematic view showing another example of a cathode structure for use in the sputtering system of FIG. 5.

(B) For example, as shown in FIG. 8, a plurality of magnets 14 are used, and the magnetizing direction is set to be perpendicular to the target surface and parallel to the substrate surface. In this case, the magnetizing directions of the adjacent magnets 14 are set to be reverse to each other.

Figure 9:
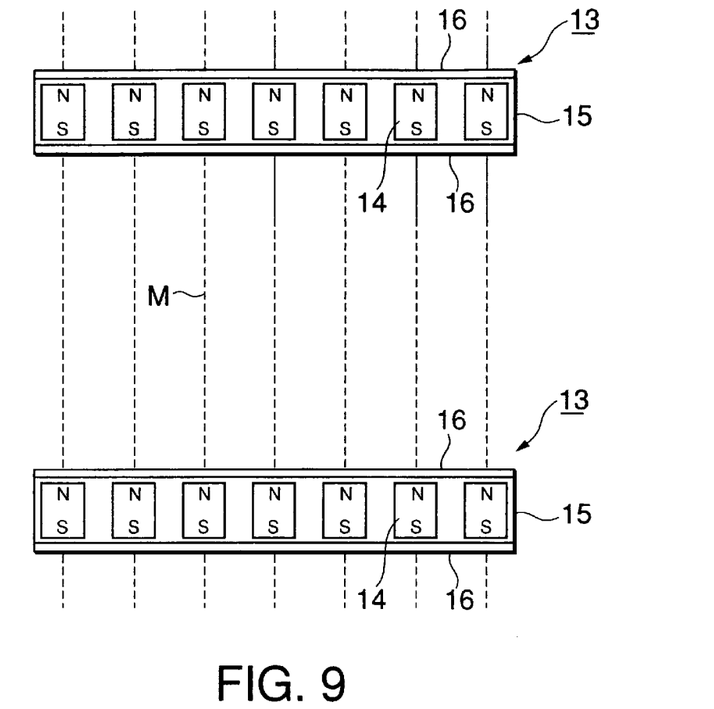
FIG. 9 is a schematic view showing a further example of a cathode structure for use in the sputtering system of FIG. 5.

(C) For example, as shown in FIG. 9, the magnetizing directions of all of magnets 14 of a plurality of cathodes 13 arranged in parallel to each other are set to be perpendicular to the target surface and parallel to the substrate surface, and the magnetizing directions of all of the magnets 14 are set to be the same.

According to the aforementioned magnet arrangements (A) and (B), a magnetic field M is formed to be closed in the vicinity of the cathode 13 as shown in FIGS. 7 and 8. When such a magnetic field M is formed, the mechanism for moving the magnets 14 is preferably provided as described above. On the other hand, according to the magnet arrangement (C), a uniform magnetic field M is formed between the adjacent cathodes 13 as shown in FIG. 9. In this case, since each of the cathode 13 has targets 16 on both sides thereof, a uniform magnetic field M is formed in each of gaps between the plurality of cathodes 13 arranged in parallel. Furthermore, a toroidal magnet or the like may be used as the magnet.

The voltage applied to the cathode 13 may be a high-frequency ac or dc voltage, and suitably selected in accordance with the material of the target. Alternatively, the plurality of cathodes 13 may be divided into some groups, and different voltages may be applied to the respective groups. In the case of a high frequency voltage, the cathodes 13 may be divided into about two groups in view of the interference therebetween. In the case of a dc voltage, the cathodes 13 may be optionally divided into a plurality of groups. If the cathodes 13 are divided into a plurality of groups to adjust the voltages applied thereto, the uniformity on the substrate can be improved by a small area of cathodes groups with respect to the thin-film deposited area of the substrate 11.

In the above described sputtering system 10, since the cathodes 13 are off-axis aligned with respect to the substrate 11, it is possible to inhibit irradiation damage caused by high energy particles radiated on the extension line of the target surface. Moreover, since the targets 16 are mounted on both sides of the flat backing plate 15, the cathodes 13 can be provided at positions including the thin-film deposited surface of the substrate 11 (at positions facing the thin-film deposited surface), unlike the conventional off-axis alignment wherein the cathodes 13 are provided only around the substrate. Therefore, even if the diameter of the substrate 11 is large, it is possible to cope with the substrate 11 only by increasing the number of the cathodes 13.

Thus, in the first preferred embodiment of a sputtering system 10 according to the present invention, the irradiation damage is inhibited by the off-axis alignment, and the cathodes 13, the number of which corresponds to the diameter of the substrate 11 and so forth, are arranged at the positions including the thin-film deposited surface of the substrate 11, so that it is possible to repeatably deposit various thin-films, which have the improved inplane uniformity of film thickness, composition, crystallinity and so forth, on a substrate 11 having a large diameter.

If the arrangements of magnets shown in FIGS. 7 and 8 are adopted, it is also possible to deposit various thin-films having excellent inplane uniformity on the large-diameter substrate 11 by increasing the number of the cathodes 13. In particular, if the arrangement of magnets shown in FIG. 9 is adopted, a uniform magnetic field M is formed in each semiclosed space between the adjacent cathodes 13, so that it is possible to more improve the inplane uniformity of composition and so forth.

Figure 10:
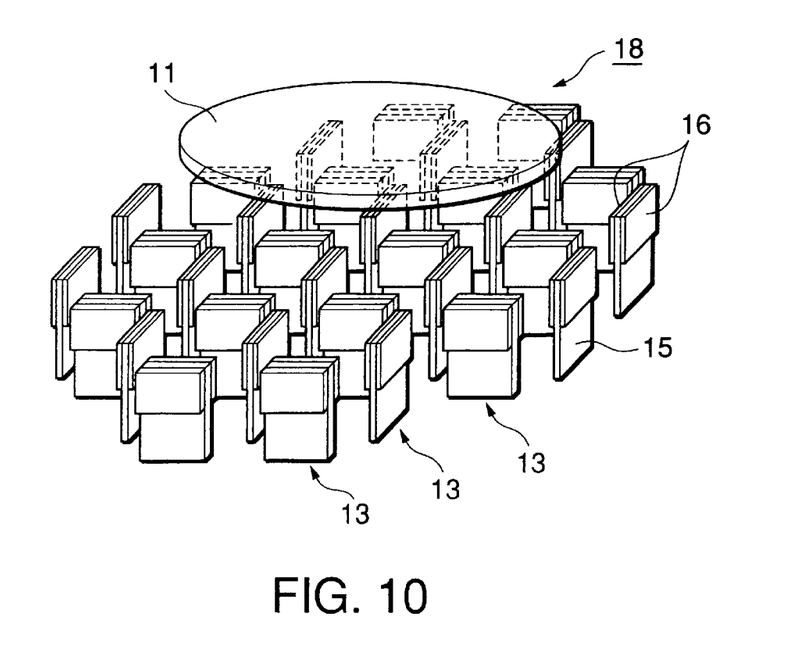
FIG. 10 is a perspective view showing a schematic structure of a principal part of the second preferred embodiment of a sputtering system according to the present invention.
Figure 11A:
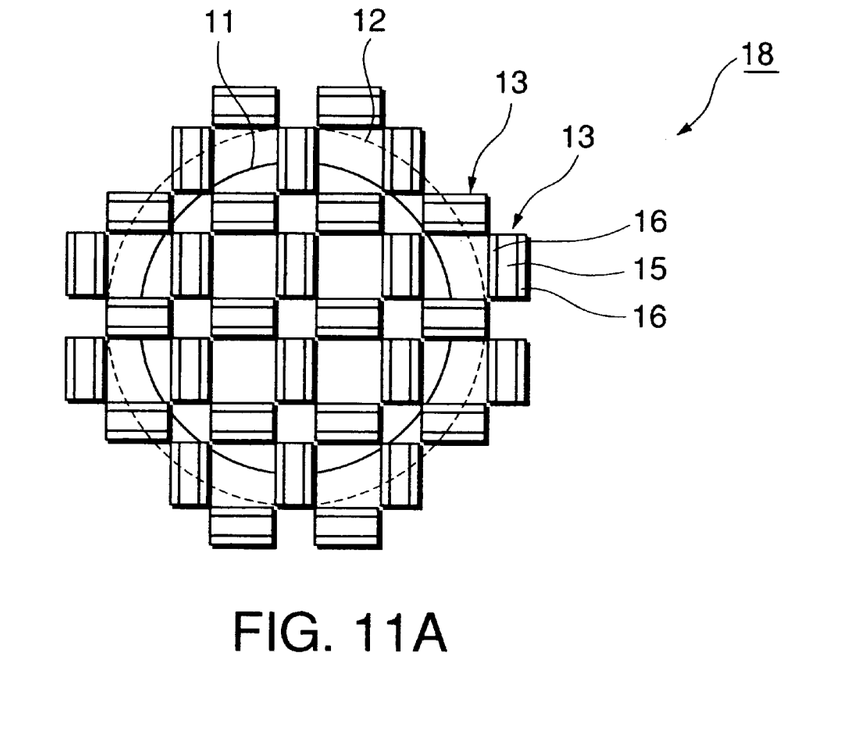
FIG. 11A is a plan view showing the arrangement of the sputtering system of FIG. 10.
Figure 11B:
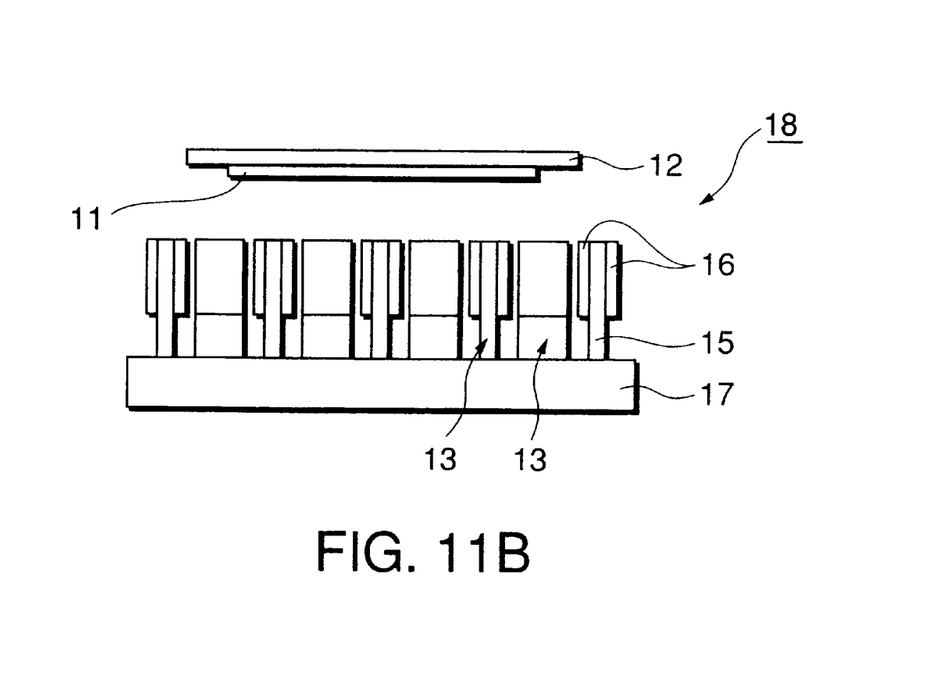
FIG. 11B is a side view thereof.

Referring to FIGS. 10, 11A and 11B, the second preferred embodiment of a sputtering system according to the present invention will be described below.

FIG. 10 is a perspective view of a principal part of the second preferred embodiment of a sputtering system according to the present invention, and FIGS. 11A and 11B are plan and side views thereof. In the off-axis sputtering system 18 shown in these drawings, cathodes 13, each of which has two targets 16, are arranged so as to face the thin-film deposited surface of a substrate 11 and associated with each other in parallel crosses, i.e., extend in two directions perpendicular thereto.

Furthermore, the structures of each of the cathodes 13 and backing plates 15, and the mounting positions and directions of the targets 16 are the same as those in the aforementioned first preferred embodiment of a sputtering system according to the present invention, and each of the targets 16 is off-axis aligned with respect to the thin-film deposited surface of the substrate 11. The angle in the off-axis alignment is the same as that in the aforementioned first preferred embodiment.

With respect to the positional relationship between the substrate 11 and the plurality of cathodes 13, at least a part of the plurality of cathodes 13 are arranged at positions including the thin-film deposited surface of the substrate 11 in the aforementioned off-axis alignment. The number of the cathodes 13 is suitably set in accordance with the diameter of the substrate 11 (the area of the thin-film deposited surface), the size of each of the cathodes 13 and the positions of the cathodes 13. For example, when a functional thin-film or the like is deposited on a substrate 11 having a diameter of about 200 mm to about 300 mm, about 20 to 50 cathodes 13 are preferably provided although the number of the cathodes 13 is different in accordance with the size of one of the cathodes 13, if the parallel cross arrangement shown in FIGS. 10 and 11A is applied.

However, when the substrate 11 and the plurality of cathodes 13 are relatively moved, the number of the cathodes 13 should not be limited to the aforementioned number, but it is possible to uniformly deposit a thin-film using a smaller number of cathodes. The plurality of cathodes 13 can be provided on a supporting table 17, so that it is possible to easily move and replace the targets 16.

Figure 12:
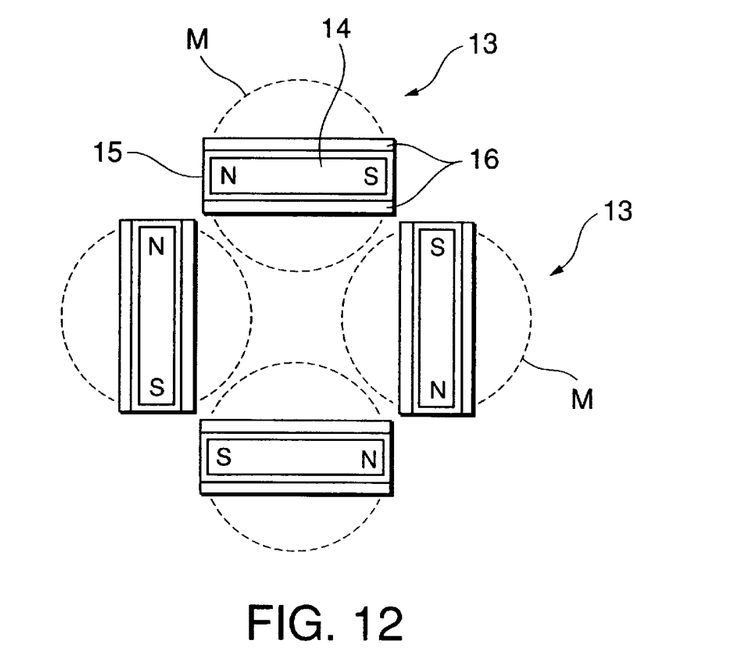
FIG. 12 is a schematic view showing an example of a cathode structure for use in the sputtering system of FIG. 10.

For example, as shown in FIG. 12, a magnet 14 is provided in each of backing plate 15. The magnetizing direction of the magnet 14 is set to be parallel to the target surface and the substrate surface. The magnets 14 provided between the adjacent cathodes 13 are arranged so that the adjacent magnetic poles are the same so as not to close a magnetic field therebetween. In accordance with the size of the backing plate 15, the magnetizing direction may be perpendicular to the substrate surface.

According to this arrangement of magnets, a magnetic field M is formed so as to be closed in the vicinity of the cathode 13 as shown in FIG. 12. When such a magnetic field M is formed, the aforementioned mechanism for moving the magnets 14 is preferably provided. Furthermore, a plurality of magnets 14 may be provided in the backing plate 15. In this case, the magnets 14 are arranged so that the magnetic poles of the adjacent magnets 14 are the same pole. Alternatively, the arrangement of magnets shown in FIG. 8 may be adopted. Moreover, toroidal magnets or the like may be used.

In the second preferred embodiment similar to the aforementioned first preferred embodiment, the voltage applied to the cathode 13 may be a high-frequency ac or dc voltage, and suitably selected in accordance with the material of the target. Alternatively, the plurality of cathodes 13 may be divided into some groups, and different voltages may be applied to the respective groups.

In the aforementioned second preferred embodiment of a sputtering system 18 according to the present invention, since the cathodes 13 are off-axis aligned with respect to the substrate 11, it is possible to inhibit irradiation damage caused by high energy particles similar to the first preferred embodiment. Moreover, since the targets 16 are mounted on both sides of the flat backing plate 15, the cathodes 13 can be provided at positions including the thin-film deposited surface of the substrate 11 (at positions facing the thin-film deposited surface). Therefore, similar to the first preferred embodiment, it is possible to cope with a substrate 11 having a large diameter only by increasing the number of the cathodes 13.

Thus, also in the second preferred embodiment of a sputtering system 18 according to the present invention, the irradiation damage is inhibited by the off-axis alignment, and the cathodes 13, the number of which corresponds to the diameter of the substrate 11 and so forth, are arranged at the positions including the thin-film deposited surface of the substrate 11, so that it is possible to repeatably deposit various thin-films, which have the improved inplane uniformity of film thickness, composition, crystallinity and so forth, on a substrate 11 having a large diameter.

The thin-films deposited by the sputtering systems 10 and 18 should not be limited to specific thin-films, but the present invention is particularly effective in oxide thin-films, which are easily damaged when negative ions, such as oxygen ions, emitted from the target 16 are accelerated by a cathode sheath to produce high energy particles which irradiate the substrate 11, e.g., functional thin-films, such as superconductive oxide films, ferromagnetic oxide films and ferroelectric oxide films. The present invention is also effective in compound thin-films other than oxide thin-films.

Furthermore, while the plurality of cathodes 13 have been parallel or perpendicular to each other in the sputtering systems 10 and 18 in the first and second preferred embodiments of the present invention, the arrangement of the cathodes according to the present invention should not be limited thereto, but various arrangements of cathodes, such as a concentric polygon arrangement, may be adopted.

Figure 13:
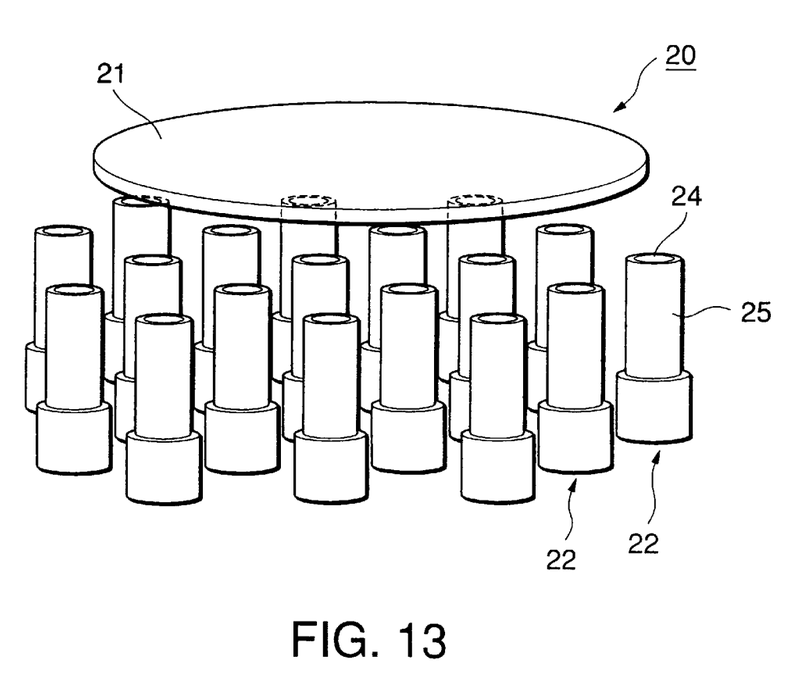
FIG. 13 is a perspective view showing a schematic structure of a principal part of the third preferred embodiment of a sputtering system according to the present invention.
Figure 14:
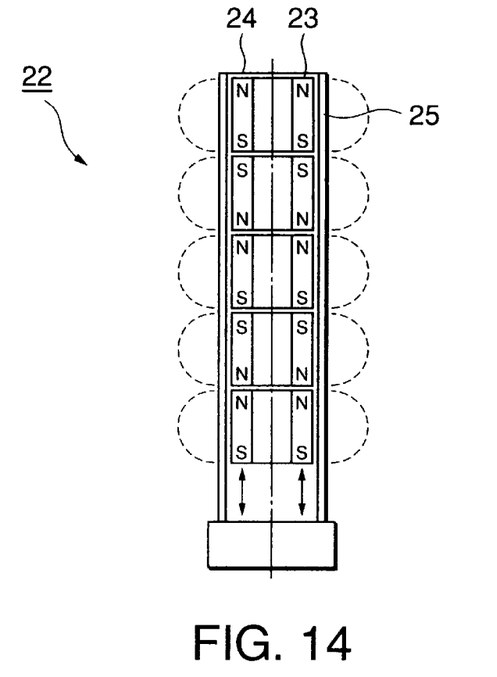
FIG. 14 is a schematic view showing an example of a cathode structure for use in the sputtering system of FIG. 13.

Referring to FIGS. 13 and 14, the third preferred embodiment of a sputtering system according to the present invention will be described below.

In the third preferred embodiment of a sputtering system 20 according to the present invention, which is shown in these drawings, a substrate 21, on which a thin-film is deposited, is held on the bottom surface of a substrate holder (not shown). A plurality of cathodes 22 project at positions facing the thin-film deposited surface of the substrate 21. Each of the plurality of cathodes 22 has a cylindrical cathode body 24, which has cylindrical magnets 23 shown in, e.g., FIG. 14 and a cooling mechanism (not shown) therein, and a cylindrical target 25 which extends along the cylindrical surface of the cylindrical cathode body 24.

That is, the cylindrical cathode 22 is arranged so that the axis of the cylindrical cathode body 25 is perpendicular to the thin-film deposited surface of the substrate 21, and the cylindrical cathode body 25 is off-axis aligned. That is, the cylindrical target 25 is arranged so that the cylindrical surface (target surface) thereof is perpendicular to the thin-film deposited surface of the substrate21. It is not always required that the angle between the substrate 21 and the target surface be strictly 90 degrees, and the angle may be suitably set to be in the range of e.g., from about 60 degree to about 120 degree, in accordance with the thin-film deposition rate and the dependency on angle. Throughout the specification, the angles in the "off-axis alignment" include the aforementioned angles.

With respect to the positional relationship between the substrate 21 and the plurality of cathodes 22, at least a part of the plurality of cathodes 22 are off -axis aligned at regular intervals at positions including the thin-film deposited surface of the substrate 21. Therefore, the component emitted from a target 25 in a direction perpendicular thereto is adhered to another target 25 of the adjacent cathode 22 to be reused. The number of the cathodes 22 is suitably set in accordance with the diameter of the substrate 21 (the area of the thin-film deposited surface), the size of each of the cathodes 22 and so forth.

In addition, the substrate 21 and the plurality of cathodes 22 can be relatively moved. In this case, it is possible to uniformly deposit a thin-film using a smaller number of cathodes. The plurality of cathodes 22 may be provided on a single supporting table. Thus, it is possible to easily move and replace the targets 22.

The magnet built in the cathode body 24 should not be limited to the permanent magnet 23, but it may be an electromagnet. A suitable magnet may be selected from these magnets. When the permanent magnet 23 is used, it is desired to use a magnet having a great coercive force, such as a neodymium-iron-boron magnet and a samarium-cobalt magnet, as the permanent magnet 23.

A single or a plurality of cylindrical magnets are used as the magnets 23 provided in the cathode body 24. The magnetizing direction of the magnet 23 is set to be parallel to the target surface and perpendicular to the substrate surface. FIG. 14 shows an example of a case where a plurality of magnets 23 are used. In this case, the plurality of magnets 23 are arranged so that the magnetic poles of the adjacent magnets 23 are the same pole, i.e., so that the magnetizing directions of the adjacent magnets 23 are reverse to each other According to such an arrangement of magnets, a magnetic field M is formed so as to be closed in the vicinity of the cathode 22 as shown in FIG. 14. In order to form such a magnetic field M, a mechanism for moving the magnets 23 is preferably provided.

Figure 15:
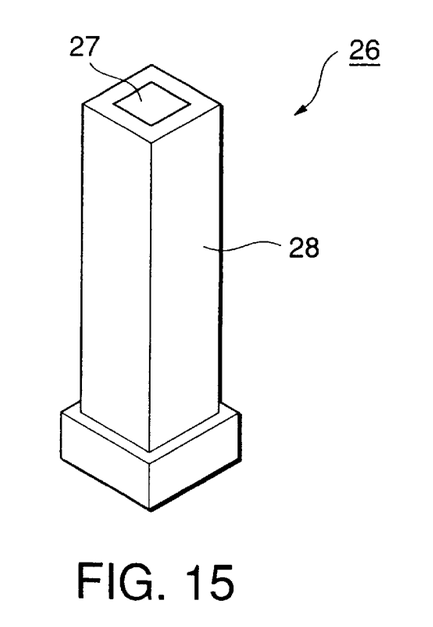
FIG. 15 is a schematic view showing another example of a cathode structure for use in the sputtering system of FIG. 13.

As described above, the columnar or prismatic cathodes off-axis aligned with respect to the thin-film deposited surface of the substrate 21 should not be limited to the cylindrical cathodes 22 shown in FIGS. 13 and 14, but the cathodes may be prismatic cathodes 26 shown in FIG. 15. The prismatic cathodes 26 are arranged so that the axes thereof are perpendicular to the substrate surface. Each of the prismatic cathodes 26 shown in FIG. 15 has a prismatic cathode body 27, in which a magnet (not shown) and a cooling mechanism are built, and a prismatic target 28 which surrounds the prismatic surface of the cathode body 27 to be supported thereon.

The voltage applied to the cathode 22 or 26 may be a high-frequency ac or dc voltage, and suitably selected in accordance with the material of the target. Alternatively, the plurality of cathodes 22 or 26 may be divided into some groups, and different voltages may be applied to the respective groups. In the case of a high frequency voltage, the cathodes may be divided into about two groups in view of the interference therebetween. In the case of a dc voltage, the cathodes may be divided into an optional number of groups. If the cathodes 22 or 26 are divided into a plurality of groups to adjust voltages applied thereto, the uniformity on the surface of the substrate can be improved by a small area of cathodes groups with respect to the thin-film deposited area of the substrate 21.

In the above described sputtering system 20, since the cathodes 22 or 26 are off-axis aligned with respect to the substrate 21, it is possible to inhibit irradiation damage caused by high energy particles radiated on the extension line of the target surface. Moreover, since the cylindrical target 25 or the prismatic target 28 is arranged along the outer periphery of the columnar or prismatic cathode body 24 or 27, the cathodes 22 or 26 can be provided at positions including the thin-film deposited surface of the substrate 21 (at positions facing the thin-film deposited surface). Therefore, if the diameter of the substrate 11 is large, it is possible to cope with the substrate 11 by increasing the number of the cathodes. In addition, the size of one of the columnar or prismatic cathodes 22 or 26 can be decreased, the cylindrical targets 25 or the prismatic targets 28 can be relatively easy to be prepared even if the targets 25 or 28 are made of an oxide.

Thus, in the third preferred embodiment of a sputtering system 20 according to the present invention, the irradiation damage is inhibited by the off-axis alignment, and the cathodes 22 or 26, the number of which corresponds to the diameter of the substrate 21 and so forth, are arranged at the positions including the thin-film deposited surface of the substrate 21, so that it is possible to repeatably deposit various thin-films, which have the improved inplane uniformity of film thickness, composition, crystallinity and so forth, on a substrate 21 having a large diameter.

Figure 16:
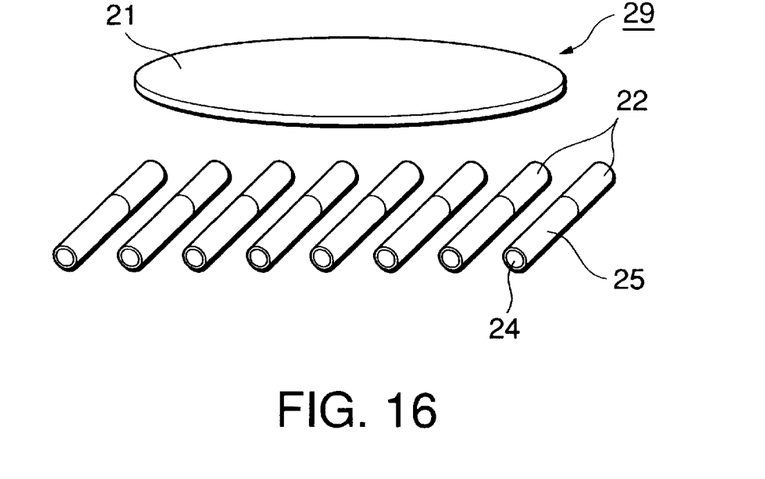
FIG. 16 is a perspective view showing a schematic structure of a principal part of the fourth preferred embodiment of a sputtering system according to the present invention.

Referring to FIG. 16, the fourth preferred embodiment of a sputtering system according to the present invention will be described below. In the sputtering system 29 shown in FIG. 16, a plurality of cylindrical cathodes 22 are arranged in parallel so that the axes of cylindrical targets 25 are parallel to the thin-film deposited surface of a substrate 21. Other constructions are the same as those of the sputtering system 20, and various conditions are also the same as those in the sputtering system 20. The number of the cylindrical cathodes 22 is suitably set in accordance with the diameter of the substrate 21 (the area of the thin-film deposited surface), the size of each of the cathodes 22 and so forth. In addition, the substrate 21 and the plurality of cathodes 22 may be relatively moved.

Since the cylindrical cathodes 22 having the cylindrical targets 25 are arranged for the substrate 21 in such a sputtering system 29, high energy particles can be emitted radially to inhibit irradiation damage caused by high energy particles. Moreover, since the plurality of cylindrical cathode 22 are arranged in parallel to the thin-film deposited surface of the substrate 21, it is possible to cope with the substrate 21 only by increasing the number of the cathodes if the diameter of the substrate 21 is large. In addition, since the size of one of the cylindrical cathodes 22 can be decreased, the cylindrical targets 25 can be relatively easy to be prepared even if the cylindrical targets 25 are made of an oxide.

Thus, in the fourth preferred embodiment of a sputtering system 18 according to the present invention, the irradiation damage is inhibited by the cylindrical targets 25, and the cathodes 22, the number of which corresponds to the diameter of the substrate 21 and so forth, are arranged at the positions including the thin-film deposited surface of the substrate 21, so that it is possible to repeatably deposit various thin-films, which have the improved inplane uniformity of film thickness, composition, crystallinity and so forth, on the substrate 21 having a large diameter.

Figure 17A:
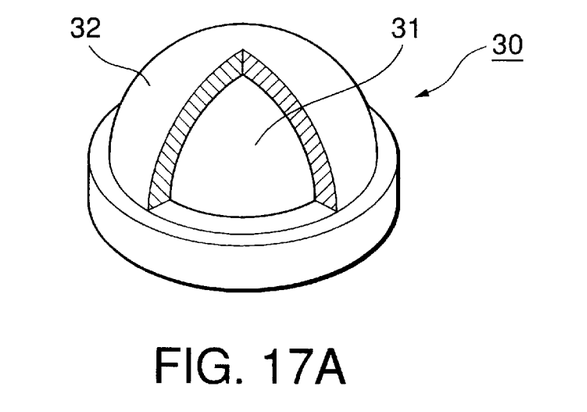
FIG. 17A is a perspective view showing another example of a cathode for use in the sputtering system of FIG. 16.
Figure 17B:
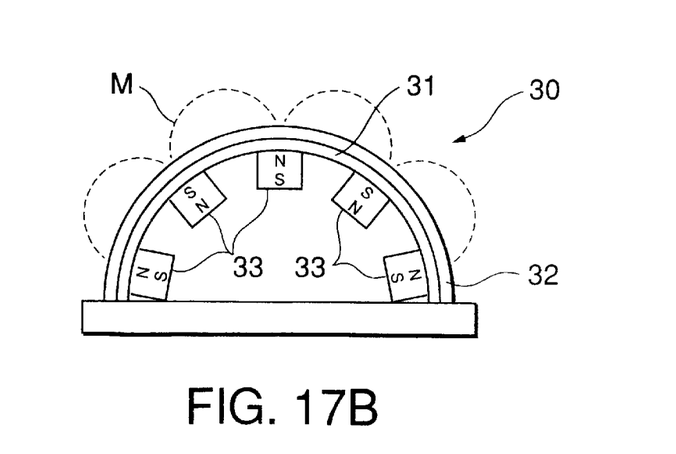
FIG. 17B is a sectional view thereof.

In place of the cylindrical cathodes 22 shown in FIGS. 13 and 14, a hemispherical cathode 30 shown in FIGS. 17A and 17B may be used. As shown in FIG. 17A, in the fifth preferred embodiment of a sputtering system according to the present invention, the hemispherical cathode 30 has a hemispherical cathode body 31, which has a cooling mechanism (not shown) therein, and a hemispherical targets 32, which extends along the hemispherical surface of the cathode body 31 to be supported thereon. A plurality of such hemispherical cathodes 30 are prepared and arranged so as to face the thin-film deposited surface of the substrate 21, so that it is possible to repeatably deposit various thin-films, which have the improved inplane uniformity of film thickness, composition, crystallinity and so forth, on the substrate 21 having a large diameter.

As shown in FIG. 17B, a plurality of magnets 33 are provided in the body 31 of the hemispherical cathode 30, and the magnetic poles thereof are arranged as shown in the drawing so as to produce a magnetic field M as shown in the drawing.

The thin-films deposited by the sputtering systems 20 and 29 should not be limited to specific thin-films, but the present invention is particularly effective in oxide thin-films, which are easily damaged by irradiation, e.g., functional thin-films, such as superconductive oxide films, ferromagnetic oxide films and ferroelectric oxide films, similar to the aforementioned first preferred embodiment. The present invention is also effective in compound thin-films other than the oxide thin-films.

With respect to the respective preferred embodiments of the present invention, examples and evaluation results will be described below.

As an evaluation result in a first example of the first preferred embodiment, an off-axis sputtering system shown in FIGS. 5, 6A, 6B and 7 was prepared. That is, five cathodes 13, each of which has a flat backing plate 15 and targets 16 having a size of 200×50×50 mm$^3$ mounted on both sides of the backing plate 15, were arranged at an interval of 50 mm so as to face an Si substrate 11 having a diameter of 150 mm supported on a substrate holder 12.

As shown in FIG. 7, each of the cathodes 13 has six neodymium-iron-boron permanent magnets 14 having a size of 30×60×3 mm³ in the backing plate 15. The magnetizing directions of the magnets 14 were set to be parallel to the target surface and the substrate surface, and the magnetizing directions of the adjacent magnets were set to be reverse to each other. The magnetic field was set to be closed in the vicinity of each of the cathodes 13 as shown in the drawing. In addition, a mechanism for allowing the whole permanent magnets 14 to reciprocate in longitudinal directions of the cathode 13 was provided in the backing plate 15.

Using such an off-axis sputtering system, a thin-film was deposited on the Si substrate at a flow ratio of Ar gas to $O_2$ gas of 4:1 at a whole pressure of 4 Pa at a total RF power of 1 kW using targets 16, all of which were made of $Yba_2Cu_3O_{7-\delta}$. As a result, a deposition rate of 3 $\mu$m/min was obtained, and a very excellent film thickness distribution of within ±5% was obtained over the whole wafer of 150 mm. In addition, an excellent composition distribution of within ±2% was obtained with respect to a composition ratio of Y/Ba/Cu.

As a second evaluation result, the whole construction of a sputtering system was substantially the same as that in the first preferred embodiment, and the arrangement of magnets in the cathode 13 was the arrangement in the second example shown in FIG. 8. That is, six neodymium-iron-boron permanent magnets 14 having a size of 15×60×3 mm³ were provided in the backing plate 15. The magnetizing directions of the magnets 14 were set to perpendicular to the target surface and parallel to the substrate surface, and the magnetizing directions of the adjacent magnets were set to be reverse to each other. The magnetic field was set to be closed in the vicinity of each of the cathodes 13 as shown in the drawing. In addition, a mechanism for allowing the whole permanent magnets 14 to reciprocate in longitudinal directions of the cathode 13 was provided in the backing plate 15.

Using such an off-axis sputtering system, a $Yba_2Cu_3O_{7-\delta}$ thin-film was deposited on the Si substrate on the same conditions as those in the first example. As a result, a thin-film having a high deposition rate and uniform film thickness, composition distribution and film quality was obtained similar to the first preferred embodiment.

As a third evaluation result, the whole construction of a sputtering system was substantially the same as that in the first example, and the arrangement of magnets in the cathode 13 was the arrangement shown in FIG. 9. That is, six neodymium-iron-boron permanent magnets 14 having a size of 20×60×3 mm³ were provided in the backing plate 15. The magnetizing directions of the magnets 14 were set to perpendicular to the target surface and parallel to the substrate surface, and the magnetizing directions of the adjacent magnets were set to be the same. As shown in FIG. 9, a magnetic field perpendicular to the target surface is formed between the adjacent cathodes 13 to close plasma between the cathodes 13.

Using such an off-axis sputtering system, a $Yba_2Cu_3O_{7-\delta}$ thin-film was deposited on the Si substrate on the same conditions as those in the first example. As a result, a thin-film having a high deposition rate and uniform film thickness, composition distribution and film quality was obtained similar to the first preferred embodiment. In particular, the composition distribution and the inplane uniformity of film quality were excellent.

The evaluation result in the second preferred embodiment will be described below.

First, an off-axis sputtering system shown in FIGS. 10, 11A and 11B was prepared. That is, 32 cathodes 13, each of which has a flat backing plate 15 and targets 16 having a size of 40×50×3 mm³ mounted on both sides of the backing plate 15, were arranged at an interval of 50 mm so as to face an Si substrate 11 having a diameter of 150 mm supported on a substrate holder 12 and so as to extend two directions perpendicular to the Si substrate.

As shown in FIG. 12, each of the cathodes 13 had a neodymium-iron-boron permanent magnet 14 having a size of 40×60×3 mm³ in the backing plate 15. The magnetizing directions of the magnets 14 were set to be parallel to the target surface and the substrate surface. In addition, the magnetizing poles of the adjacent magnets were set to be the same so that a magnetic field is not closed between the adjacent cathodes 13.

Using such an off-axis sputtering system, a thin-film was deposited on the Si substrate at a flow ratio of Ar gas to $O_2$ gas of 4:1 at a whole pressure of 4 Pa at a total RF power of 1 kW using targets 16, all of which were made of $Yba_2Cu_3O_{7-\delta}$. As a result, a deposition rate of 3 $\mu$m/min was obtained, and a very excellent film thickness distribution of within ±5% was obtained over the whole wafer of 150 mm. In addition, an excellent composition distribution of within ±2% was obtained with respect to a composition ratio of Y/Ba/Cu.

The evaluation result in the third preferred embodiment shown in FIGS. 13 and 14 will be described below.

In the evaluation result in the third preferred embodiment, an off-axis sputtering system shown in FIGS. 13 and 14 was prepared. That is, 19 cathodes 22, each of which has a cylindrical target 25 having an outer diameter of 26 mm and a length of 100 mm, were arranged at an interval of 50 mm as to form an equilateral triangle to face an Si substrate 21 having a diameter of 150 mm supported on a substrate holder so that the axes of the cathodes 22 are perpendicular to the surface of the substrate.

As shown in FIG. 13, each of the cathodes 22 had five cylindrical neodymium-iron-boron permanent magnets, each of which has an outer diameter of 15 mm and a length of 18 mm therein. The magnetizing directions of the magnets were set to be parallel to the axis of the cathode, and the magnetizing directions of the adjacent magnets are reverse to each other to close a magnetic field in the vicinity of each of the cathodes 22 as shown in the drawing. In addition, a mechanism for allowing the whole permanent magnets to reciprocate in longitudinal directions of the cathode was provided therein.

Using such an off-axis sputtering system, a thin-film was deposited on the Si substrate at a flow ratio of Ar gas to $O_2$ gas of 4:1 at a whole pressure of 4 Pa at a total RF power of 1.5 kW using targets 25, all of which were made of $Yba_2Cu_3O_{7-\delta}$. As a result, a deposition rate of 2 $\mu$m/min was obtained, and a very excellent film thickness distribution of within ±4% was obtained over the whole wafer of 150 mm. In addition, an excellent composition distribution of within ±2% was obtained with respect to a composition ratio of Y/Ba/Cu.

The evaluation result in the fourth preferred embodiment shown in FIG. 16 will be described below.

First, an off-axis sputtering system shown in FIG. 16 was prepared. That is, 8 cathodes 22, each of which has a cylindrical target 25 having an outer diameter of 22 mm and a length of 200 mm, were arranged at an interval of 35 mm as to face an Si substrate 21 having a diameter of 150 mm supported on a substrate holder so that the axes of the cathodes 22 are perpendicular to the surface of the substrate.

The internal structure of each of the cathodes 22 was substantially the same as that in the fifth preferred embodiment.

Using such an off-axis sputtering system, a thin-film was deposited on the Si substrate at a flow ratio of Ar gas to $O_2$ gas of 4:1 at a whole pressure of 4 Pa at a total RF power of 1.5 kW using targets 25, all of which were made of $Yba_2Cu_3O_{7-\delta}$. As a result, a deposition rate of 3 μm/min was obtained, and a very excellent film thickness distribution of within ±5% was obtained over the whole wafer of 150 mm. In addition, an excellent composition distribution of within ±2% was obtained with respect to a composition ratio of Y/Ba/Cu.

As described above, according to any one of the preferred embodiments of a sputtering system of the present invention, it is possible to stably prepare a thin-film, which has an excellent inplane uniformity of film thickness, composition and crystallinity, on a substrate having a large diameter, particularly a high functional film, while inhibiting the substrate from being damaged by the irradiation with high speed particles during the deposition of the thin-film.

What is claimed is:

1. A sputtering system for depositing a thin-film on or above a surface of a substrate, comprising:

a substrate holder for holding said substrate; and a plurality of cathodes, each of which has a flat backing plate including a magnet therein, and a target having a face surface mounted on each of a front side and a backside of said backing plate, wherein, said substrate is absent from a first space which is formed by projecting the face surface of the targets as a base of said first space in a direction perpendicular to said face surface, and at least a part of said plurality of cathodes is present in a second space which is formed by projecting said surface of said substrate as a base of said second space in a direction perpendicular to said surface of said substrate.

2. The sputtering system according to claim 1, wherein said plurality of cathodes are arranged in parallel to each other.

3. The sputtering system according to claim 1, wherein said plurality of cathodes are arranged so as to be associated with each other in parallel crosses.

4. A sputtering system for depositing a thin film on or above a surface of a substrate, comprising:

a substrate holder for holding said substrate; and a plurality of cathodes, each of which has a columnar or prismatic backing plate including a columnar or prismatic magnet therein, and a target having a face surface extending along an outer peripheral surface of said columnar or prismatic backing plate and mounted on said backing plate, wherein, said substrate is absent from a third space which is formed by projecting the face surface of the targets as a base of said third space in a direction perpendicular to said face surface, and at least a part of said substrate is present in a fourth space which is formed by projecting an end surface of said backing plate as a base surface of said fourth space in a direction perpendicular to said end surface of said backing plate, and said plurality of cathodes are arranged in parallel to each other, and at least a part of said plurality of cathodes is present in a fifth space which is formed by projecting said surface of said substrate as a base of said fifth space in a direction perpendicular to said surface of said substrate.

5. The sputtering system according to claim 4, wherein said backing plate is a cylindrical backing plate, and said target extends along a side surface of said cylindrical backing plate to be supported on said side surface of said cylindrical backing plate.

6. The sputtering system according to claim 4, wherein said backing plate is a prismatic backing plate, and said target extends along side surfaces of said prismatic backing plate to be supported on said side surfaces of said prismatic backing plate.

7. The sputtering system according to claim 4, wherein said end surface of said columnar or prismatic backing plate opposes to the thin film deposited surface of the substrate.

8. The sputtering system according to claim 4, wherein said columnar or prismatic backing plate further includes a cooling mechanism.

9. A sputtering system for depositing a thin film on or above a surface of a substrate, comprising:

a substrate holder for holding said substrate; and a plurality of cathodes, each of which has a flat backing plate including a magnet therein, and a target having a face surface supported on a surface of said flat backing plate, wherein, said substrate is absent from a first area which is formed by extending the face surface of the targets as a base of said first area in a direction perpendicular to said face surface, and at least a part of said plurality of cathodes is present in a second area which is formed by extending said surface of said substrate as a base of said second area in a direction perpendicular to said surface of said substrate.

10. The sputtering system according to claim 9, wherein said plurality of cathodes are arranged in parallel to each other.

11. The sputtering system according to claim 9, wherein said plurality of cathodes are arranged so as to be associated with each other in parallel crosses.

12. A sputtering system for depositing a thin-film, comprising:

a substrate for receiving said thin-film;

a substrate holder for holding said substrate; and a plurality of cathodes, each of which has a backing plate including a magnet therein, and a target having a face surface mounted on said backing plate, wherein, said substrate is absent from a first space which is formed by projecting the face surface of the targets in a direction perpendicular to said face surface, and at least a part of said plurality of cathodes is present in a second space which is formed by projecting said surface of said substrate in a direction perpendicular to said surface of said substrate.

13. The sputtering system according to claim 12, wherein said plurality of cathodes comprises at least three cathodes.

14. The sputtering system according to claim 12, wherein said plurality of cathodes comprises at least five cathodes.

* * * * *